United States Patent
Yamaguchi et al.

(12) 
(10) Patent No.: US 6,399,225 B1
(45) Date of Patent: Jun. 4, 2002

(54) SILICON-AND-NITROGEN-CONTAINING LUMINESCENT SUBSTANCE, METHOD FOR FORMING THE SAME, AND LIGHT EMITTING DEVICE USING THE SAME

(75) Inventors: Kenji Yamaguchi; Kazuki Mizushima; Kouichi Sassa, all of Omiya (JP)

(73) Assignee: Mitsubishi Materials Corporation, Tokyo (JP)

( * ) Notice: Subject to any disclaimer, the term of this patent is extended or adjusted under 35 U.S.C. 154(b) by 0 days.

(21) Appl. No.: 09/519,452

(22) Filed: Mar. 6, 2000

(30) Foreign Application Priority Data

Mar. 23, 1999 (JP) ............................................. 11-077188

(51) Int. Cl.$^7$ ........................ H05B 33/14; C01B 33/00; C01B 21/00
(52) U.S. Cl. ........................ 428/690; 428/917; 428/704; 428/446; 428/448; 428/450; 313/503; 313/506; 252/301.4 F; 423/324; 423/344; 423/351; 423/406; 427/66
(58) Field of Search ................................. 428/690, 917, 428/704, 446, 448, 450; 313/503, 506; 252/301.4 F; 423/324, 344, 351, 406; 427/66

(56) References Cited

U.S. PATENT DOCUMENTS 4,766,471 A * 8/1988 Ovshinsky et al. ............ 357/2

OTHER PUBLICATIONS

L. T. Canham, "Silicon Quantum Wire Array Fabrication By Electrochemical And Chemical Dissolution Of Wafers", Appl. Phys. Lett., vol. 57, No. 10, Sep. 3, 1990, pp. 1046–1048.

* cited by examiner

Primary Examiner—Cynthia H. Kelly
Assistant Examiner—Ling Xu
(74) Attorney, Agent, or Firm—Oblon, Spivak, McClelland, Maier & Neustadt, P.C.

(57) ABSTRACT

A luminescent substance contains silicon and nitrogen as major components and has an amorphous structure. The silicon content of the luminescent substance is greater than the stoichiometric silicon content of $Si_3N_4$, and the luminous intensity of the luminescent substance has a maximum at approximately 2.2 eV. The luminescent substance has a high luminous efficiency and a short luminous decay lifetime. A light-emitting device includes this luminescent substance and a substrate. The luminescent substance can be readily formed on the substrate by a chemical vapor deposition process.

8 Claims, 2 Drawing Sheets

SILICON-AND-NITROGEN-CONTAINING LUMINESCENT SUBSTANCE, METHOD FOR FORMING THE SAME, AND LIGHT EMITTING DEVICE USING THE SAME

BACKGROUND OF THE INVENTION

1. Field of the Invention

The present invention relates to a silicon-based luminescent substance which is used in optical interconnection for optical communication and in visible light sources. The present invention also relates to a method for forming the luminescent substance, and to a light-emitting device using the luminescent substance.

2. Description of the Related Art

Compound semiconductors of, for example, gallium arsenide are candidates for light-emitting devices formed on silicon substrates for optical interconnection. In the compound semiconductors, it is difficult to produce structures having low defects on the silicon substrates, and thus, the compound semiconductors exhibit poor thermal stability. Moreover, the compound semiconductors cannot be produced only by conventional production processes for silicon integrated circuits, and additional processes result in increased production costs. Accordingly, novel production technologies have been awaited to make silicon-based light-emitting structures using only conventional production processes for silicon integrated circuits.

Porous silicon formed by anodization is known as a silicon-based luminescent substance (L. T. Canham, Appl. Phys. Lett., Vol. 57, No. 10, Sep. 3, 1990, pp. 1046–1048). Porous silicon, however, exhibits low luminous efficiency and a long luminous decay lifetime on the order of microseconds ($\mu$sec). Since the production process includes complicated electrochemical wet processing, the process cannot be easily applied to production of silicon integrated circuits. Moreover, the resulting porous silicon is fragile.

SUMMARY OF THE INVENTION

Accordingly, it is an object of the present invention to provide a luminescent substance which can be formed on a substrate using a production process for silicon integrated circuits, which exhibits high luminous efficiency and a short luminous decay lifetime on the order of nanoseconds.

It is another object of the present invention to provide a method for making the luminescent substance at reduced cost.

It is still another object of the present invention to provide a light-emitting device using the luminescent substance which is used as a visible light source.

In a first aspect of the present invention, a luminescent substance comprises silicon and nitrogen as major components, the luminescent substance has an amorphous structure, the silicon content of the luminescent substance is greater than the stoichiometric silicon content of $Si_3N_4$, and the luminous intensity of the luminescent substance has a maximum at approximately 2.2 eV.

In the luminescent substance, there are dense and fine structures which contributes to light emission at approximately 2.2 eV. Thus, the luminescent substance exhibits high luminous efficiency and a short luminous decay lifetime.

Preferably, in the luminescent substance, the silicon is dispersed in a microcrystalline state and/or an amorphous state.

In a second aspect of the present invention, a method for forming a luminescent substance on a substrate comprises preparing silane ($SiH_4$) and ammonia ($NH_3$) as source gasses, and forming the luminescent substance on the substrate by one of a reduced pressure chemical vapor deposition process and a chemical vapor deposition process at a gas flow ratio of $SiH_4/(SiH_4+NH_3)$ of at least 0.1 and at a deposition temperature of 600 to 1,400° C. so that the luminescent substance comprises silicon and nitrogen as major components, has a silicon-enriched amorphous structure, and has a maximum luminous intensity at approximately 2.2 eV (hereinafter, this method is referred to as a first method).

In a third aspect of the present invention, a method for forming a luminescent substance on a substrate comprises preparing dichlorosilane ($SiH_2Cl_2$) and ammonia ($NH_3$) as source gasses, and forming the luminescent substance on the substrate by one of a reduced pressure chemical vapor deposition process and a chemical vapor deposition process at a gas flow ratio of $SiH_2Cl_2/(SiH_2Cl_2+NH_3)$ of at least 0.1 and at a deposition temperature of 600 to 1,400° C. so that the luminescent substance comprises silicon and nitrogen as major components, has a silicon-enriched amorphous structure, and has a maximum luminous intensity at approximately 2.2 eV (hereinafter, this method is referred to as a second method).

In a fourth aspect of the present invention, a method for forming a luminescent substance on a substrate comprises preparing trichlorosilane ($SiHCl_3$) and ammonia ($NH_3$) as source gasses, and forming the luminescent substance on the substrate by one of a reduced pressure chemical vapor deposition process and a chemical vapor deposition process at a gas flow ratio of $SiHCl_3/(SiHCl_3+NH_3)$ of at least 0.1 and at a deposition temperature of 600 to 1,400° C. so that the luminescent substance comprises silicon and nitrogen as major components, has a silicon-enriched amorphous structure, and has a maximum luminous intensity at approximately 2.2 eV (hereinafter, this method is referred to as a third method).

Preferably, in the second to fourth aspects, the gas flow ratio lies in a range of 0.2 to 0.7, and the deposition temperature lies in a range of 700 to 1,200° C.

According to the first to third methods, the luminescent substance can be readily formed using a conventional system, such as a reduced pressure chemical vapor deposition system or a chemical vapor deposition system, with reduced production costs.

In a fifth aspect of the present invention, a light emitting device comprises a substrate and a luminescent layer comprising a luminescent substance. The luminescent substance comprises silicon and nitrogen as major components and has an amorphous structure, the silicon content of the luminescent layer is greater than the stoichiometric silicon content of $Si_3N_4$, and the luminous intensity of the luminescent substance has a maximum at approximately 2.2 eV.

The light-emitting device having a high luminous intensity at approximately 2.2 eV is suitable for use with optical fibers in the fields of optical interconnection.

DESCRIPTION OF THE PREFERRED EMBODIMENT

In the first method of the present invention, a luminescent substance of silicon and nitrogen having a silicon-enriched amorphous structure is formed onto a substrate by a reduced pressure chemical vapor deposition process or a chemical vapor deposition process using silane ($SiH_4$) and ammonia ($NH_3$) as source gasses at a gas flow ratio of $SiH_4/(SiH_4+NH_3)$ of at least 0.1 and at a deposition temperature of 600 to 1,400° C.

In the second method of the present invention, a luminescent substance of silicon and nitrogen having a silicon-enriched amorphous structure is formed onto a substrate by a reduced pressure chemical vapor deposition process or a chemical vapor deposition process using dichlorosilane ($SiH_2Cl_2$) and ammonia ($NH_3$) as source gasses at a gas flow ratio of $SiH_2Cl_2/(SiH_2Cl_2+NH_3)$ of at least 0.1 and at a deposition temperature of 600 to 1,400° C.

In the third method of the present invention, a luminescent substance of silicon and nitrogen having a silicon-enriched amorphous structure is formed onto a substrate by a reduced pressure chemical vapor deposition process or a chemical vapor deposition process using trichlorosilane ($SiHCl_3$) and ammonia ($NH_3$) as source gasses at a gas flow ratio of $SiHCl_3/(SiHCl_3+NH_3)$ of at least 0.1 and at a deposition temperature of 600 to 1,400° C.

In the first to third methods, silicon is not enriched in the deposited layer at a gas flow ratio of less than 0.1. In such a case, the luminescent substance does not have a high luminous efficiency at approximately 2.2 eV. Moreover, silicon is not enriched in the deposited layer at a deposition temperature of less than 600° C. Thus, the luminescent substance does not have a high luminous efficiency at approximately 2.2 eV. In addition, such a low deposition temperature results in a decreased deposition rate. At a deposition temperature above 1,400° C., the luminous efficiency at approximately 2.2 eV is low due to a change in the structure of the deposited layer.

The luminescent substance formed by any one of the first to third methods has a maximum luminous intensity at approximately 2.2 eV, and shows a high luminous efficiency and a short luminous decay lifetime.

Preferably, in the first to third methods, the gas flow ratio lies in a range of 0.2 to 0.7, and the deposition temperature lies in a range of 700 to 1,200° C. The luminescent substance formed under the above conditions exhibits a high intensity of light emission at an optical energy of approximately 2.2 eV. Thus, the luminescent substance has a higher luminous efficiency and a shorter luminous decay lifetime.

Figure 3:
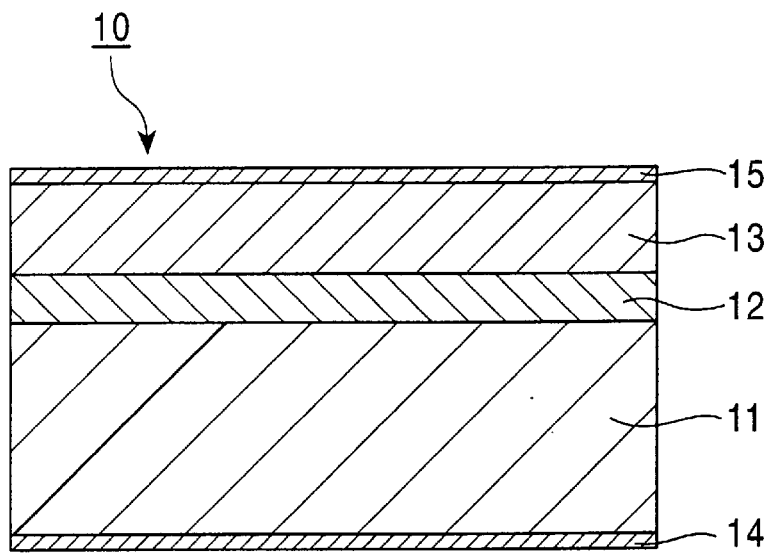
FIG. 3 is a cross-sectional view of a light-emitting device of the present invention.

With reference to FIG. 3, the light-emitting device in accordance with the present invention includes a substrate 11 and a luminescent layer of the luminescent substance formed by one of the above methods. The substrate 11 is preferably composed of silicon. The luminescent layer exhibits a high luminous efficiency and a short luminous decay lifetime.

When the substrate 11 is a p-type silicon substrate, an n-type silicon layer 13 as a clad layer is formed on the luminescent layer 12. When the substrate 11 is an n-type silicon substrate, a p-type silicon layer 13 is formed on the luminescent layer 12. The luminescent layer 12 and then the n- or p-type silicon layer 13 can be continuously and effectively formed using the same reduced pressure chemical vapor deposition system or the same chemical vapor deposition system. Next, an electrode 15 and an electrode 14 are formed on the upper face of the silicon layer 13 and the lower face of the substrate 11, respectively. A light-emitting device (LED) 10 is thereby formed.

The light-emitting device 10 may be a metal-insulator-semiconductor (MIS) structure which does not have the silicon layer 13. Alternatively, the light-emitting device 10 may be formed by doping an n-type dopant into a p-type substrate or a p-type dopant into an n-type substrate. The light-emitting device in accordance with the present invention can be fabricated in an integrated circuit (IC).

The methods in accordance with the present invention do not use expensive molecular beam epitaxy (MBE) systems or metal-organic chemical vapor deposition (MOCVD) systems: the methods use a reduced pressure chemical vapor deposition system or a chemical vapor deposition system, which is widely used in production of silicon electronic devices. Thus, the methods in accordance with the present invention include a simplified process with reduced production costs.

EXAMPLES

Examples of the present invention will now be described with reference to the drawings.

Example 1

Figure 1:
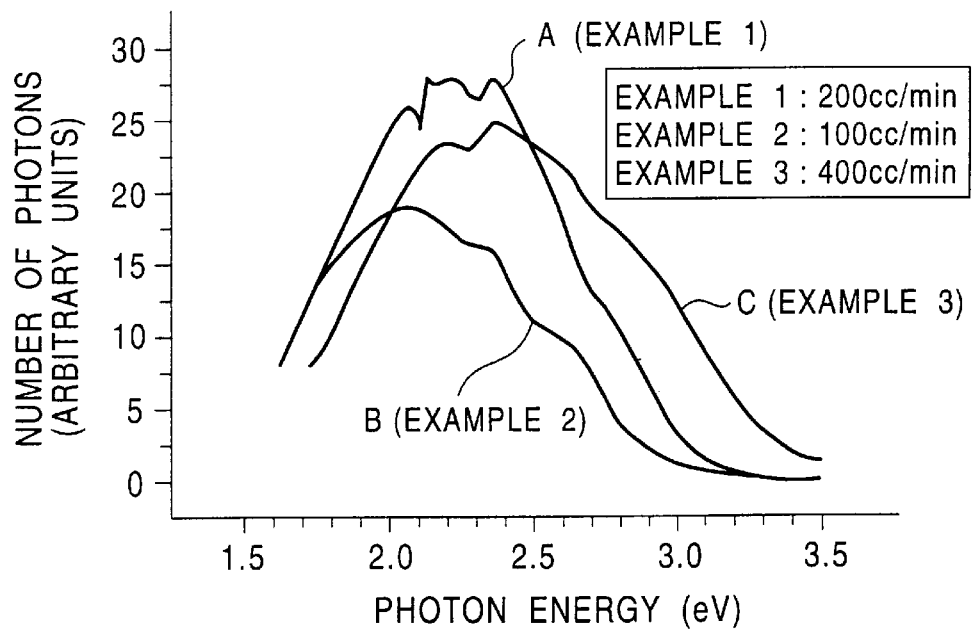
FIG. 1 is a graph showing the relationship between the photon energy and the number of photons in luminescent substances of Examples 1 to 3.

A luminescent substance containing silicon and nitrogen as major components and having an amorphous structure was deposited on a silicon substrate using a reduced pressure chemical vapor deposition system under the following conditions. Onto a silicon wafer as the silicon substrate, which was cleaned by an RCA process and had (001) plane crystal orientation, a luminescent layer having a thickness of 200 nm was formed by supplying gaseous $SiH_2Cl_2$ and $NH_3$ at a gas flow rate of 200 cc/min for each gas and a deposition temperature of 775° C. under a gas pressure of 0.3 Torr for 30 minutes. Thus, the gas flow ratio of $SiH_2Cl_2/(SiH_2Cl_2+NH_3)$ was 0.5. The curve A in FIG. 1 shows a light emission spectrum when the luminescent layer was excited by a He-Cd laser (325 nm). The emitted light could be visually observed and the luminescent layer had a maximum luminous intensity at 2.2 eV.

Figure 4:
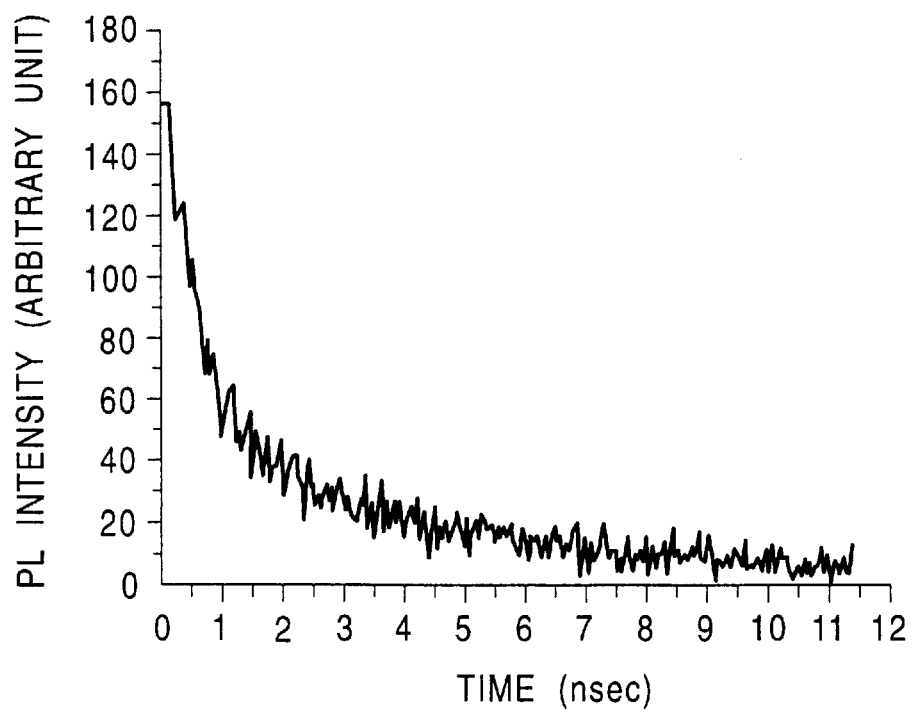
FIG. 4 is a graph showing the relationship between the photoluminescence intensity and the luminescing time of the luminescent substance of Example 1.

FIG. 4 is a graph showing a change in the luminous intensity with the time, that is, the luminous decay lifetime, which was measured by a time-resolved photoluminescence (PL) method. The luminous intensity (PL intensity) decreased to 1/e after approximately 1 nsec, and thus the luminescent layer had a luminous decay lifetime on the order of nanoseconds.

Example 2

A luminescent layer having a thickness of 150 nm was deposited on a silicon substrate as in Example 1, except that the gas flow rate of gaseous $NH_3$ was 100 cc/min. Thus, the gas flow ratio of $SiH_2Cl_2/(SiH_2Cl_2+NH_3)$ was 0.66. The curve B in FIG. 1 shows a light emission spectrum when this luminescent layer was excited by a He—Cd laser (325 nm). The spectrum B of the emitted light shows a Gaussian distribution and a half-width of approximately 1 eV.

Example 3

A luminescent layer having a thickness of 300 nm was deposited on a silicon substrate as in Example 1, except that the gas flow rate of gaseous $NH_3$ was 400 cc/min. Thus, the gas flow ratio of $SiH_2Cl_2/(SiH_2Cl_2+NH_3)$ was 0.33. The curve C in FIG. 1 shows a light emission spectrum when this luminescent layer was excited by a He-Cd laser (325 nm). The spectrum C of the emitted light shows a Gaussian distribution and a half-width of approximately 1 eV.

Example 4

Figure 2:
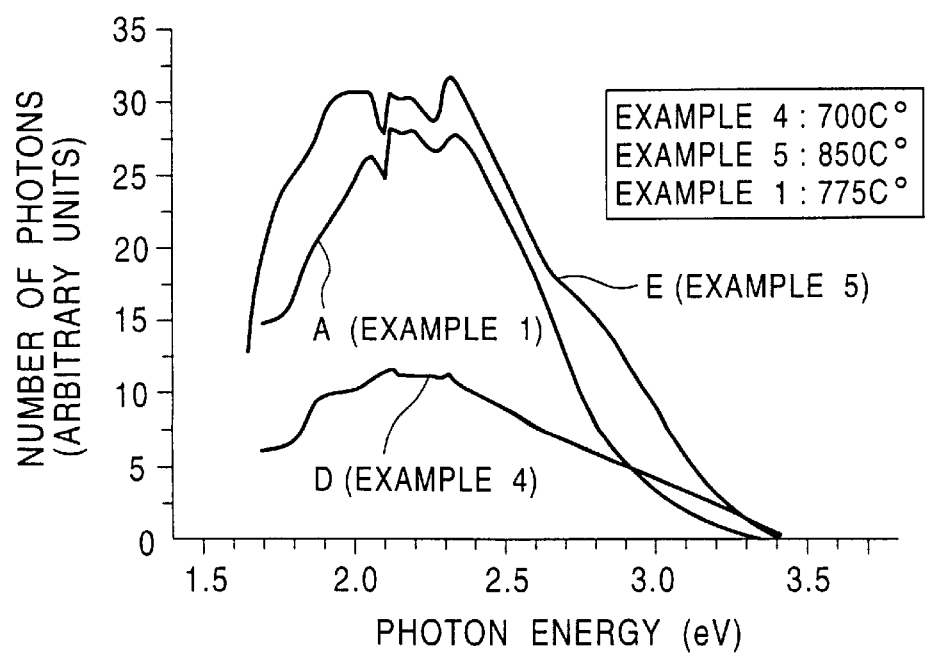
FIG. 2 is a graph showing the relationship between the photon energy and the number of photons in luminescent substances of Examples 4 to 6.

A luminescent layer having a thickness of 100 nm was deposited on a silicon substrate as in Example 1, except that the deposition temperature was 700° C. The curve D in FIG. 2 shows a light emission spectrum when this luminescent layer was excited by a He-Cd laser (325 nm). The luminescent layer had a maximum luminous intensity at 2.2 eV.

Example 5

A luminescent layer having a thickness of 400 nm was deposited on a silicon substrate as in Example 1, except that the deposition temperature was 850° C. The curve E in FIG. 2 shows a light emission spectrum when this luminescent layer was excited by a He—Cd laser (325 nm). The luminescent layer has a maximum luminous intensity at 2.2 eV. FIG. 2 also includes the spectrum A of Example 1 for comparison with the spectra D and E.

Example 6

A pIn (p-insulator-n) light-emitting device 10 shown in FIG. 3 was formed as follows. A luminescent substance containing silicon and nitrogen as major components and having an amorphous structure was deposited on a silicon substrate using a reduced pressure chemical vapor deposition system under the following conditions.

Onto a highly doped p-type silicon wafer 11 as the silicon substrate, which was cleaned by an RCA process and had (001) plane crystal orientation, a luminescent layer 12 having a thickness of 10 nm was formed by supplying gaseous $SiH_2Cl_2$ and $NH_3$ at a gas flow rate of 200 cc/min for each gas and a deposition temperature of 775° C. under a gas pressure of 0.3 Torr for 90 seconds. Thus, the gas flow ratio of $SiH_2Cl_2/(SiH_2Cl_2+NH_3)$ was 0.5. Using silane ($SiH_4$) and arsine ($AsH_3$) as source gases, a highly doped n-type silicon layer 13 having a thickness of 100 nm was deposited onto the luminescent layer 12. Using a vapor deposition system, an aluminum electrode 14 was formed on the lower face of the p-type silicon substrate 11 and then an Au—Sb alloy electrode 15 was formed on the upper face of the n-type silicon layer 13.

A normal biasing voltage of 3 V was applied to the resulting light-emitting device 10 and emitted light having a maximum luminous intensity at 2.2 eV was visually observed.

What is claimed is:

1. A luminescent substance comprising silicon and nitrogen, wherein the luminescent substance has an amorphous structure, the silicon content of the luminescent substance is greater than the stoichiometric silicon content of $Si_3N_4$, and the luminous intensity of the luminescent substance has a maximum at approximately 2.2 eV.

2. A method for forming a luminescent substance on a substrate comprising the steps of:

preparing silane ($SiH_4$) and ammonia ($NH_3$) as source gasses; and depositing the luminescent substance on the substrate by one of a reduced pressure chemical vapor deposition process and a chemical vapor deposition process at a gas flow ratio of $SiH_4/(SiH_4+NH_3)$ of at least 0.1 and at a deposition temperature of 600 to 1,400° C. so that the luminescent substance comprises silicon and nitrogen as major components, has a silicon-enriched amorphous structure, and has a maximum luminous intensity at approximately 2.2 eV.

3. A method for forming a luminescent substance on a substrate according to claim 2, wherein the gas flow ratio lies in a range of 0.2 to 0.7, and the deposition temperature lies in a range of 700 to 1,200° C.

4. A method for forming a luminescent substance on a substrate comprising the steps of:

preparing dichlorosilane ($SiH_2Cl_2$) and ammonia ($NH_3$) as source gasses; and depositing the luminescent substance on the substrate by one of a reduced pressure chemical vapor deposition process and a chemical vapor deposition process at a gas flow ratio of $SiH_2Cl_2/(SiH_2Cl_2+NH_3)$ of at least 0.1 and at a deposition temperature of 600 to 1,400° C. so that the luminescent substance comprises silicon and nitrogen as major components, has a silicon-enriched amorphous structure, and has a maximum luminous intensity at approximately 2.2 eV.

5. A method for forming a luminescent substance on a substrate according to claim 4, wherein the gas flow ratio lies in a range of 0.2 to 0.7, and the deposition temperature lies in a range of 700 to 1,200° C.

6. A method for forming a luminescent substance on a substrate comprising:

preparing trichlorosilane ($SiHCl_3$) and ammonia ($NH_3$) as source gasses; and depositing the luminescent substance on the substrate by one of a reduced pressure chemical vapor deposition process and a chemical vapor deposition process at a gas flow ratio of $SiHCl_3/(SiHCl_3+NH_3)$ of at least 0.1 and at a deposition temperature of 600 to 1,400° C. so that the luminescent substance comprises silicon and nitrogen as major components, has a silicon-enriched amorphous structure, and has a maximum luminous intensity at approximately 2.2 eV.

7. A method for forming a luminescent substance on a substrate according to claim 6, wherein the gas flow ratio lies in a range of 0.2 to 0.7, and the deposition temperature lies in a range of 700 to 1,200° C.

8. A light emitting device comprising:

a substrate; and a luminescent layer comprising a luminescent substance;

wherein the luminescent substance comprises silicon and nitrogen and has an amorphous structure, the silicon content of the luminescent layer is greater than the stoichiometric silicon content of $Si_3N_4$, and the luminous intensity of the luminescent substance has a maximum at-approximately 2.2 eV.

* * * * *